United States Patent
Potts et al.

(10) Patent No.: US 7,592,120 B2
(45) Date of Patent: *Sep. 22, 2009

(54) STRUCTURED THERMAL TRANSFER DONORS

(75) Inventors: John E. Potts, Woodbury, MN (US); Martin B. Wolk, Woodbury, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/181,398

(22) Filed: Jul. 29, 2008

(65) Prior Publication Data

US 2008/0286681 A1    Nov. 20, 2008

Related U.S. Application Data

(63) Continuation of application No. 11/551,276, filed on Oct. 20, 2006, now Pat. No. 7,419,757.

(51) Int. Cl.
*G03F 7/34* (2006.01)
(52) U.S. Cl. ............ 430/200; 428/32.6; 428/32.8; 428/32.87
(58) Field of Classification Search ............ 430/200; 428/32.6, 32.8, 32.87
See application file for complete search history.

(56) References Cited

U.S. PATENT DOCUMENTS

| 5,650,215 | A | 7/1997 | Mazurek et al. |
|---|---|---|---|
| 5,725,989 | A | 3/1998 | Chang et al. |
| 5,882,774 | A | 3/1999 | Jonza et al. |
| 6,123,890 | A | 9/2000 | Mazurek et al. |
| 6,197,397 | B1 | 3/2001 | Sher et al. |
| 6,284,425 | B1 | 9/2001 | Staral et al. |
| 6,468,715 | B2 | 10/2002 | Hoffend, Jr. et al. |
| 6,521,324 | B1 | 2/2003 | Debe et al. |
| 6,524,675 | B1 | 2/2003 | Mikami et al. |
| 6,586,153 | B2 | 7/2003 | Wolk et al. |
| 6,770,337 | B2 | 8/2004 | Debe et al. |
| 6,855,384 | B1 | 2/2005 | Nirmal et al. |
| 6,866,979 | B2 | 3/2005 | Chang et al. |
| 7,419,757 | B2 * | 9/2008 | Potts et al. ............ 430/200 |
| 2003/0178124 | A1 | 9/2003 | Mikami et al. |
| 2005/0048295 | A1 | 3/2005 | Kim et al. |
| 2005/0157157 | A1 | 7/2005 | Tsukamoto et al. |
| 2006/0073406 | A1 | 4/2006 | Kang et al. |

FOREIGN PATENT DOCUMENTS

| KR | 10-2005-0082952 | 8/2005 |
|---|---|---|
| KR | 10-2006-0089838 | 9/2006 |

\* cited by examiner

*Primary Examiner*—Thorl Chea
(74) *Attorney, Agent, or Firm*—Lance L. Vietzke

(57) ABSTRACT

A laser induced thermal imaging (LITI) donor film having a substrate, a light-to-heat conversion layer overlaying the substrate, and a transfer layer overlaying the light-to-heat conversion layer. A surface of the transfer layer includes microstructured or nanostructured features, in a continuous or discontinuous pattern, embossed or otherwise imparted in the transfer layer. The features provide break points to assist in release and transfer of portions of the transfer layer to a permanent receptor in a pattern defined by the features.

15 Claims, 5 Drawing Sheets

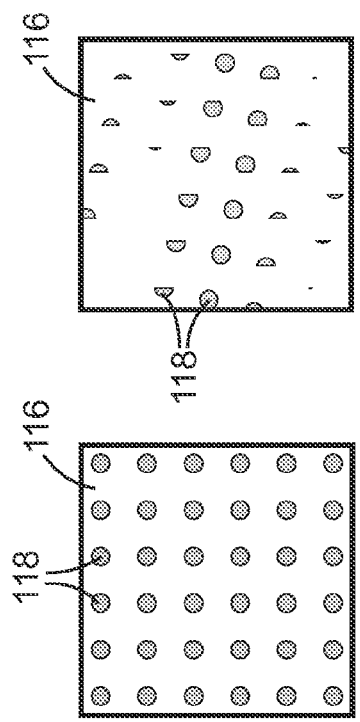
FIG. 7a
FIG. 7b
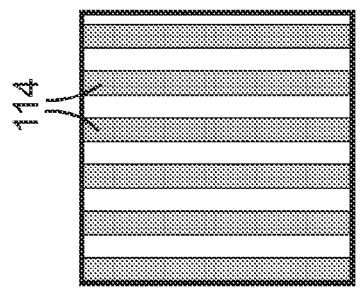
FIG. 7c
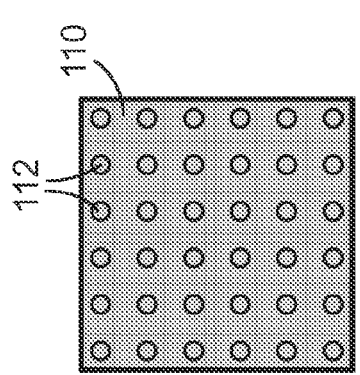
FIG. 7d
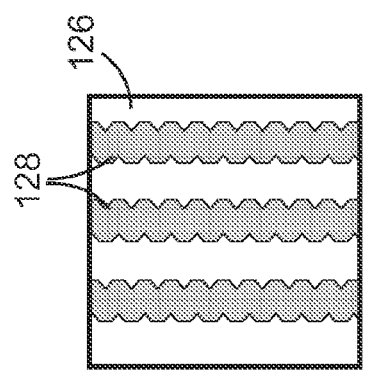
FIG. 8a
FIG. 8b
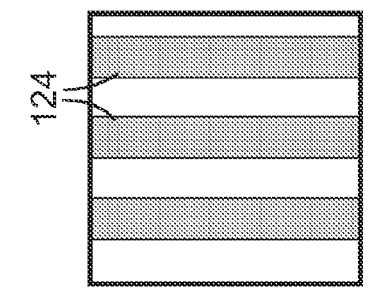
FIG. 8c
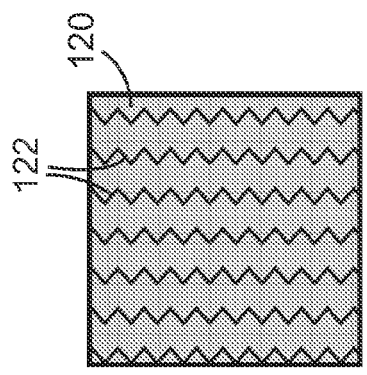

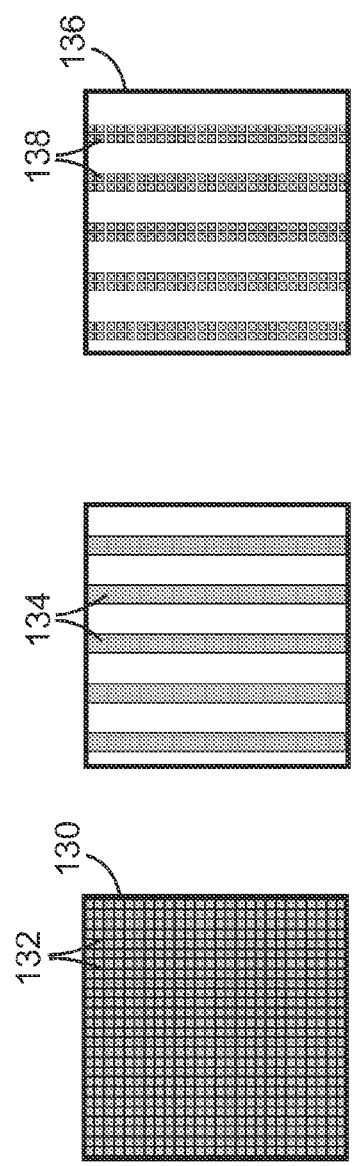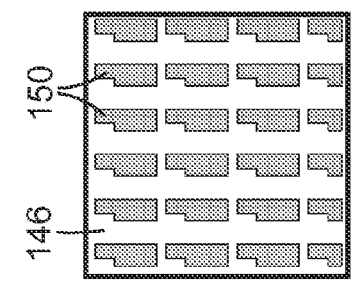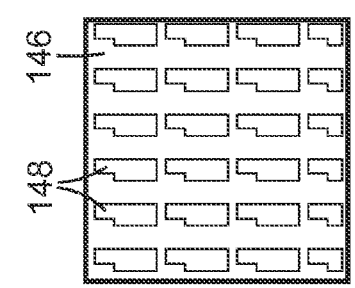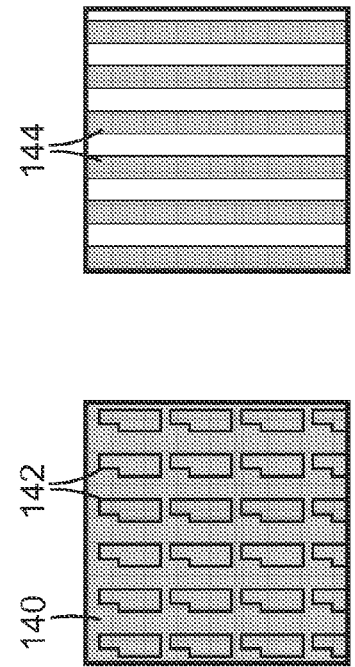

STRUCTURED THERMAL TRANSFER DONORS

CROSS REFERENCE TO RELATED APPLICATIONS

This is a continuation of the application Ser. No. 11/551,276 filed on Oct. 20, 2006, which is now U.S. Pat. No. 7,419,757, the disclosure of which is incorporated by reference in its entirely herein.

FIELD OF INVENTION

The present invention relates to microstructured or nanostructured thermal transfer donors. The present invention further relates to methods for fabricating and using microstructured or nanostructured thermal transfer donors to make devices.

BACKGROUND

A general trend exists to reduce the size of many articles and devices used in industrial and consumer applications, particularly in electronic devices. In addition, a variety of articles and devices utilize microstructured surfaces. These articles and devices often require microstructured or nanostructured surfaces, layers, or components. Microstructured and nanostructured surfaces and layers can be useful, for example, in films, tapes, coated adhesives, optical elements, organic light emitting diode (OLED) devices, electroluminescence devices, field emission cathodes for display devices, fluid control films having capillary channels, bioanalytical and biomolecular processing devices, chemical sensors, bioabsorption substrates, and patterned electronic components and circuits.

In at least some instances it is inconvenient, economically unfeasible, or difficult to form these nanostructured features, layers, surfaces, and components on a desired substrate. For example, the nanostructured features of a field emission device may be difficult to form in a desired pattern on a substrate. Known techniques for patterning small features on substrates include, for example, ablation or adhesive lift-off techniques to remove a portion of a previously formed layer of nanostructured features. However, these methods may require multiple steps, may produce excessive waste materials, and tend to be expensive.

SUMMARY

A LITI donor film, consistent with the present invention, includes a substrate, a light-to-heat conversion layer overlaying the substrate, and a transfer layer overlaying the light-to-heat conversion layer. A surface of the transfer layer includes a plurality of microstructured or nanostructured features, and the donor film is configured and arranged for transfer of at least a portion of the transfer layer to a receptor in a pattern defined by the features.

A method of preparing a LITI donor film, consistent with the present invention includes the following steps: providing a substrate having a surface and a light-to-heat conversion layer applied to it; applying a transfer layer over the light-to-heat conversion layer; and treating a surface of the transfer layer to form a plurality of microstructured or nanostructured features in the surface of the transfer layer such that the donor film is configured and arranged for transfer of at least a portion of the transfer layer to a receptor in a pattern defined by the features.

A first method of fabricating a microstructured or nanostructured article, consistent with the present invention, includes the following steps: providing a LITI donor film; placing LITI donor film against a surface of a permanent receptor such that the transfer layer is in contact with the surface of the receptor; and selectively transferring at least a portion of the transfer layer to the surface of the permanent receptor. The LITI donor film for the first method includes a substrate, a light-to-heat conversion layer overlaying the substrate, and a transfer layer overlaying the light-to-heat conversion layer and having a plurality of microstructured or nanostructured features such that the donor film is configured and arranged for transfer of at least a portion of the transfer layer to a receptor in a pattern defined by the features.

A second method of fabricating a microstructured or nanostructured article, consistent with the present invention, includes the following steps: providing a LITI donor film; placing the LITI donor film against a surface of a permanent receptor including a tool having a plurality of microstructured or nanostructured features and with the transfer layer in contact with the microstructured or nanostructured features of the tool; and selectively transferring at least a portion of the transfer layer to the surface of the permanent receptor having the tool. The LITI donor film for the second method includes a substrate, a light-to-heat conversion layer overlaying the substrate, and a transfer layer overlaying the light-to-heat conversion layer such that the donor film is configured and arranged for transfer of at least a portion of the transfer layer to a receptor in a pattern defined by the features.

BRIEF DESCRIPTION OF THE DRAWINGS

The accompanying drawings are incorporated in and constitute a part of this specification and, together with the description, explain the advantages and principles of the invention. In the drawings.

FIGS. 7a-7d are top views illustrating transfer of discontinuous features that have dimensions smaller than the width of the scanned laser beam;

FIGS. 8a-8c are top views illustrating transfer of features that are continuous in the direction of the laser scan, even if these continuous features contain details smaller than the dimensions of the scanned laser beam;

FIGS. 9a-9c are top views illustrating transfer of features that are discontinuous in the direction of the laser scan, even if these discontinuous features contain details smaller than the dimensions of the scanned laser beam; and FIGS. 10a-10d are top views illustrating transfer of features in a particular pattern to match a pattern in the surface of the underlying receptor.

DETAILED DESCRIPTION

Embodiments of the present invention can be applicable to the formation of articles having a layer with a surface defining microstructured or nanostructured features, as well as thermal transfer donors and methods for making the articles.

It should be understood that by specifying an order in the present specification (e.g., order of steps to be performed, order of layers on a substrate, etc.), it is not meant to preclude intermediates between the items specified, as long as the items appear in the order as specified. Furthermore, as used herein:

The term "device" includes an electronic or optical component that can be used by itself or with other components to form a larger system.

The term "microstructures" refers to features of a surface that have at least one dimension (e.g., height, length, width, or diameter) of less than one millimeter.

The term "nanostructures" refers to features of a surface that have at least one dimension (e.g., height, length, width, or diameter) of less than one micron.

The microstructures or nanostructures can be protruding from a surface, extending into a surface, or a combination, resulting in a non-planar surface.

Examples of films with structured adhesive on a surface of them are described in U.S. Pat. Nos. 6,524,675 and 6,123, 890, both of which are incorporated herein by reference.

LITI Donor Film and Patterning

Figure 1:
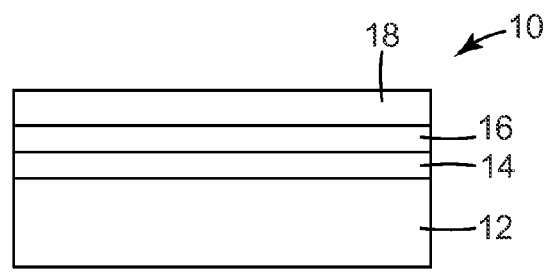
FIG. 1 illustrates a thermal transfer donor including a transfer layer.

FIG. 1 is a side view illustrating a patterned LITI donor film 10. As shown in FIG. 1, LITI donor film 10 typically includes a donor substrate 12, a light-to-heat conversion (LTHC) layer 14, an optional interlayer 16, and a transfer layer 18.

Various layers of an exemplary LITI donor film, and methods to image it, are more fully described in U.S. Pat. Nos. 6,866,979; 6,586,153; 6,468,715; 6,284,425; and 5,725,989, all of which are incorporated herein by reference as if fully set forth.

The donor substrate 12 provides support for the layers of the thermal transfer donor (film 10). One suitable type of polymer film is a polyester film, for example, polyethylene terephthalate (PET) or polyethylene naphthalate (PEN) films. However, other films with sufficient optical properties can be used, if light is used for heating and transfer. The donor substrate, in at least some instances, is flat so that uniform coatings can be formed. The donor substrate is also typically selected from materials that remain stable despite heating of any layers in the thermal transfer donor (e.g., an LTHC layer). A suitable thickness for the donor substrate ranges from, for example, 0.025 millimeters (mm) to 0.15 mm, preferably 0.05 mm to 0.1 mm, although thicker or thinner donor substrates may be used.

The LTHC layer 14 typically includes a radiation absorber that absorbs incident radiation (e.g., laser light) and converts at least a portion of the incident radiation into heat to enable transfer of the transfer layer from the thermal transfer donor to the permanent receptor. Alternatively, radiation absorbers can be included in one or more other layers of the donor film in addition to or in place of the LTHC layer. Typically, the radiation absorber in the LTHC layer (or other layers) absorbs light in the infrared, visible, and/or ultraviolet regions of the electromagnetic spectrum. The radiation absorber is typically highly absorptive of the selected imaging radiation, providing an optical density at the wavelength of the imaging radiation in the range of 0.2 to 3, and preferably from 0.5 to 2. Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Examples of other suitable radiation absorbers can include carbon black, metal oxides, and metal sulfides.

The optional interlayer 16 may be used in the thermal transfer donor to minimize damage and contamination of the transferred portion of the transfer layer and may also reduce distortion in the transferred portion of the transfer layer. The interlayer may also influence the adhesion of the transfer layer to the rest of the thermal transfer donor. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer layer (e.g., the nanostructured layer and, optionally, the release layer). Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer. The interlayer may contain additives, including, for example, photoinitiators, surfactants, pigments, plasticizers, and coating aids.

The transfer layer 18 typically includes one or more layers for transfer to a receptor. These one or more layers may be formed using organic, inorganic, organometallic, and other materials. Organic materials include, for example, small molecule materials, polymers, oligomers, dendrimers, and hyperbranched materials. The thermal transfer layer can include a transfer layer that can be used to form, for example, light emissive elements of a display device, electronic circuitry, resistors, capacitors, diodes, rectifiers, electroluminescent lamps, memory elements, field effect transistors, bipolar transistors, unijunction transistors, metal-oxide semiconductor (MOS) transistors, metal-insulator-semiconductor transistors, charge coupled devices, insulator-metal-insulator stacks, organic conductor-metal-organic conductor stacks, integrated circuits, photodetectors, lasers, lenses, waveguides, gratings, holographic elements, filters for signal processing (e.g., add-drop filters, gain-flattening filters, cut-off filters, and the like), optical filters, mirrors, splitters, couplers, combiners, modulators, sensors (e.g., evanescent sensors, phase modulation sensors, interferometric sensors, and the like), optical cavities, piezoelectric devices, ferroelectric devices, thin film batteries, or combinations thereof, for example the combination of field effect transistors and organic electroluminescent lamps as an active matrix array for an optical display. Other items may be formed by transferring a multi-component transfer assembly or a single layer.

A permanent receptor for receiving transfer layer 18 may be any item suitable for a particular application including, but not limited to, transparent films, display black matrices, passive and active portions of electronic displays, metals, semiconductors, glass, various papers, and plastics. Examples of receptor substrates include anodized aluminum and other metals, plastic films (e.g., polyethylene terephthalate, polypropylene), indium tin oxide coated plastic films, glass, indium tin oxide coated glass, flexible circuitry, circuit boards, silicon or other semiconductors, and a variety of different types of paper (e.g., filled or unfilled, calendered, or coated).

For thermal transfer using radiation (e.g., light), a variety of radiation-emitting sources can be used with LITI donor film. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power (e.g. $\geq 100$ mW) single mode laser diodes, fiber-coupled laser diodes, and diode-pumped solid state lasers (e.g., Nd:YAG and Nd:YLF). Laser exposure dwell times can be in the range from, for example, about 0.1 microsecond to 100 microseconds and laser fluences can be in the range from, for example, about 0.01 J/cm$^2$ to about 1 J/cm$^2$. During imaging, the thermal transfer layer is typically brought into intimate contact with a permanent receptor adapted to receive at least a portion of the transfer layer. In at least some instances, pressure or vacuum may be used to hold the thermal transfer layer in intimate contact with the receptor. A radiation source may then be used to heat the LTHC layer or other layers containing radiation absorbers in an image-wise fashion (e.g., digitally or by analog exposure through a mask) to perform image-wise transfer of the transfer layer from the thermal transfer layer to the receptor according to a pattern.

Structured Transfer Layers

Figures 2A, 2B:
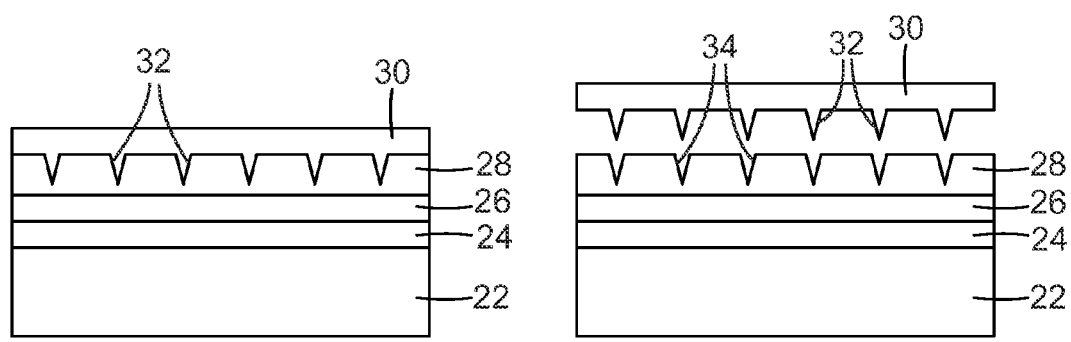
FIGS. 2a and 2b illustrate a thermal transfer donor including a transfer layer embossed by a tool.

FIGS. 2a and 2b illustrate a LITI donor film 20 including a transfer layer embossed by a tool. Donor film 20 includes a substrate 22, an LTHC layer 24, an optional interlayer 26, and a transfer layer 28. In film 20, substrate 22, LTHC 24, optional interlayer 26, and transfer layer 28 may correspond, respectively, with substrate 12, LTHC 14, interlayer 16, and transfer layer 18 as described above and prior to structuring, and film 20 can be constructed and imaged using the exemplary methods described above.

A tool 30 having microstructured or nanostructured features 32 is used to emboss a surface of transfer layer 28, as shown in FIG. 2a. The embossing by use of a tool is particularly useful when polymeric coatings are used as the transfer layer. Following embossing and as shown in FIG. 2b, transfer layer 28 has microstructured or nanostructured features 34 indented in it and corresponding with features 32. Tool 30 is typically formed from a machined metal material and can be made using, for example, wire electrical discharge machining, diamond turning machining, flycutting, milling, grinding, engraving, etching, photolithography, or any microreplication technique. Tool 30 may also be formed from hard, but nonmetallic, tools using a variety of other processes including semiconductor device fabrication processes or laser ablation. Tool 30 can be used to essentially emboss transfer layer 28 to create features 34 extending into the transfer layer. For example, tool 30 may be placed against transfer layer 28 using pressure and heat to emboss the surface of transfer layer 28, and then tool 30 is removed before imaging film 20.

Structured portions 32 of tool 30 can be microstructured, nanostructured, or a combination of both, and they can be configured in any two-dimensional geometric pattern. The pattern can include continuous features, discontinuous features, or a combination of them. Discontinuous features can be used to form microperforations, for example, assisting in release of the transfer layer when imaged along the microperforations. A particularly useful pattern may include a grid of substantially rectangular features, forming microstructured or nanostructured tiles of continuous or discontinuous features. The grid can provide for break points when imaging film 20. The term "break points" refers to areas that assist in the release of portions of a transfer layer when imaged; for example, they can include areas of the transfer layer thinner than the maximum thickness of the transfer layer or weaker areas of the transfer layer that more easily release in comparison to other areas of the transfer layer.

In addition to polymeric transfer layers, inorganic (e.g., silicon nitride, indium tin oxide, metallic, etc.) coatings can form the transfer layer and be structured. If malleable metals form the transfer layer, they can be structured through mechanical embossing as described above with respect to tool 30. If brittle inorganic materials (e.g., ceramics, glasses, etc.) form the transfer layer, they can be structured in other ways such as through laser ablation to form the microstructured or nanostructured pattern in the transfer layer. An alternative to laser ablation includes deposition of inorganic materials through a screen-like shadow mask onto the donor film to form the structured transfer layer. Another alternative includes deposition of the inorganic materials onto the donor film to form the transfer layer and then use of a lithographic method to etch the perforations or separations in order to create a structured pattern in the transfer layer material. These methods can provide a useful way to transfer metal foils, for example. In particular, after deposited to form the transfer layer, the metal foils can be laser etched to create the features for break points and then imaged along portions of the break points to transfer portions of the metal foils to a permanent receptor. As an alternative, the metal foils or other fusible elements can undergo a post-imaging step involving sintering or otherwise processing them in order to remove the transferred break points and fuse the transferred tiles or other structures; this post-imaging sintering step can provide for the transferred structures to become in physical contact with one another and possibly capable of transmitting electrical signals among them.

Figure 3:
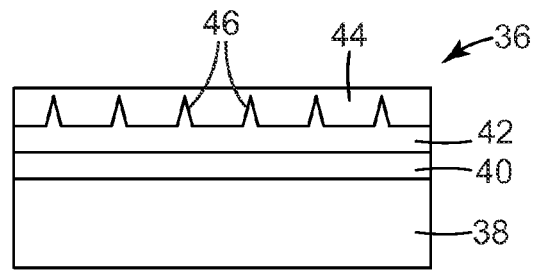
FIG. 3 illustrates a thermal transfer donor including a transfer layer and a structured interlayer.

FIG. 3 illustrates a LITI donor film 36 including a transfer layer and a structured interlayer. Donor film 36 includes a substrate 38, an LTHC layer 40, an interlayer 42, and a transfer layer 44. In film 36, substrate 38, LTHC 40, interlayer 42, and transfer layer 44 may correspond, respectively, with substrate 12, LTHC 14, interlayer 16, and transfer layer 18 as described above and prior to structuring, and film 36 can be constructed and imaged using the exemplary methods described above. Interlayer 42 has microstructured or nanostructured features 46 indented in transfer layer 44. Interlayer 42 can be structured in a variety of ways. For example, a tool having essentially the inverse surface shape of the structured interlayer can be used as to structure interlayer 42 in the same manner tool 30 is used to emboss the transfer layer as described above. When transfer layer 42 is applied over interlayer 42, the features 46 extending into transfer layer 44 create break points in it. Interlayer 42 can be created with any two-dimensional configuration of microstructured or nanostructured features. As an alternative, if an interlayer is not used, the LTHC layer can be structured in the same or similar manner in order to impart structure into the transfer layer.

Figure 4:
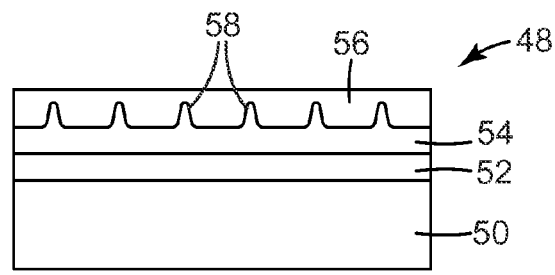
FIG. 4 illustrates a thermal transfer donor including a transfer layer having areas patterned from a photo-sensitive layer.

FIG. 4 illustrates a LITI donor film 48 including a transfer layer having areas patterned from a photo-sensitive layer. Donor film 48 includes a substrate 50, an LTHC layer 52, an optional interlayer 54, and a transfer layer 56. In film 48, substrate 50, LTHC 52, optional interlayer 54, and transfer layer 56 may correspond, respectively, with substrate 12, LTHC 14, interlayer 16, and transfer layer 18 as described above and prior to structuring, and film 48 can be constructed and imaged using the exemplary methods described above. A series of microstructured or nanostructured areas 58 are created within the photo-sensitive interlayer 54. Before application of transfer layer 56, the areas 58 are exposed to light of a sufficient intensity and duration to create weak points, and thus break points, upon coating of transfer layer 56 on the photo-sensitive interlayer 54. For example, areas 58 can be exposed to light through a mask. Those break points can be used to assist in the release of portions of transfer layer 56 when imaged. Photo-sensitive interlayer 54 can be created with any two-dimensional configuration of microstructured or nanostructured areas.

Any of the structured transfer layers described above can include additional features. For example, they can include stratified layers, meaning multiple layers isotropic in-plane to the film and anisotropic in the z-direction perpendicular to the in-plane direction. An example of such layers is disclosed in U.S. Pat. No. 5,882,774 (Jonza et al.), which is incorporated herein by reference. The transfer layers can also include a structure on structure pattern. For example, they can have nanostructured features on microstructured features. They can also include a combination of types of features. For example, the transfer layers can be structured on both sides, possibly by use of a structured interlayer on one side and use of a tool to structure the opposite side. The microstructured or nanostructured features of the transfer layer can be arranged in a regular pattern, irregular pattern, random pattern, or pseudo-random pattern. The pattern of features can be continuous or discontinuous, as further described below. The pattern of features can be, but need not be, substantially retained or preserved after transfer to a permanent receptor. The shape of the microstructured or nanostructured features can be configured to provide for particular optical or mechanical properties of the transfer layer.

The microstructured or nanostructured features can be, but need not be, of substantially uniform length and shape. Exemplary ranges of dimensions for the features are as follows: in the in-plane direction (directions substantially parallel to the plane of the laser beam scan), the features can be in the range from about 0.01 micron to 100 microns; and the height of the features (the z-direction substantially perpendicular to the in-plane direction) can be in the range from about 1 nanometer to 10 microns or even to 100 microns.

Figure 5A:
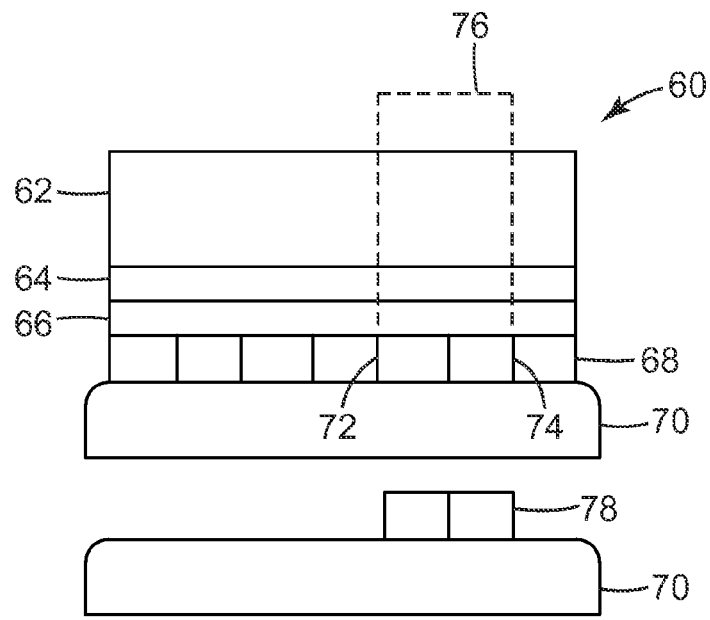
FIG. 5a illustrates imaging of a thermal transfer donor including a structured transfer layer in order to transfer portions of the transfer layer to a permanent receptor.
Figure 5B:
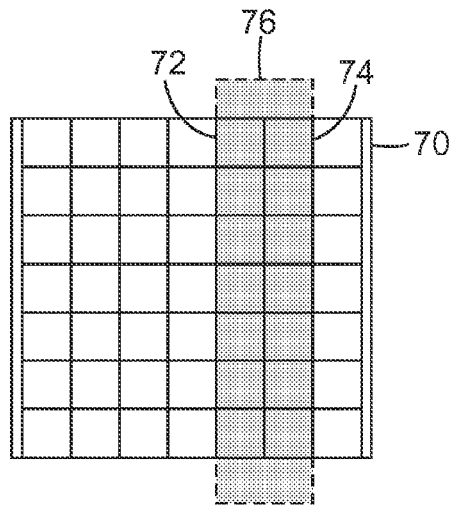
FIGS. 5b and 5c are top views illustrating imaging of the thermal transfer donor of FIG. 5a before and after, respectively, transfer of a portion of the structured transfer layer.
Figure 5C:
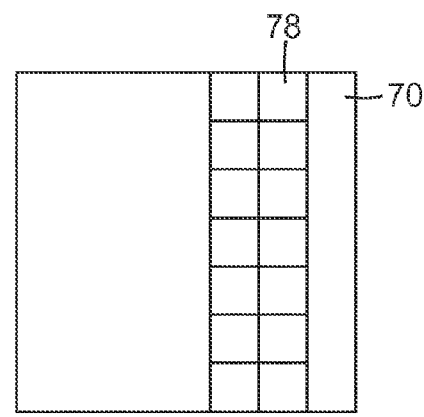

FIG. 5a illustrates imaging of a LITI donor film 60 including a transfer layer in order to transfer portions of the transfer layer to a permanent receptor 70. FIGS. 5b and 5c are top views illustrating imaging of the LITI donor film 60 before and after, respectively, transfer of a portion of the structured transfer layer 68. Donor film 60 includes a substrate 62, LTHC layer 64, optional interlayer 66, and a structured transfer layer 68 having microstructured or nanostructured features, or a combination, such as those described above and as represented by break points 72 and 74. In film 60, substrate 62, LTHC 64, and optional interlayer 66 may correspond, respectively, with substrate 12, LTHC 14, and interlayer 16 as described above, and transfer layer 68 may correspond with any of the structured transfer layers described above. Transfer layer 68 can include any two-dimensional configuration of the structured portions. By using one of the methods described above, for example, to create the features in transfer layer 68, it is structured to include break points as represented by break points 72 and 74.

When imaged at the break points 72 and 74 using a laser beam 76 and an imaging method such as that described above, a portion 78 is transferred to permanent receptor 70. The imaging at the break points, as shown in FIGS. 5a and 5b, is intended to be representative of actual imaging conditions, and the laser beam may extend slightly beyond the break points for imaging in the embodiments described in the present specification and imaging of other structured donor films. As shown in FIGS. 5a and 5c, the portion 78 is transferred in a pattern defined by the structured features and, preferably, the entire transferred portion or substantially all of it has a pattern defined by the structured features. During imaging, donor film 60 is typically held in intimate contact with permanent receptor 70, and the break points 72 and 74 assist in providing a release of portion 78 from transfer layer 68 and a well defined edge to transferred portion 78.

Figure 6A:
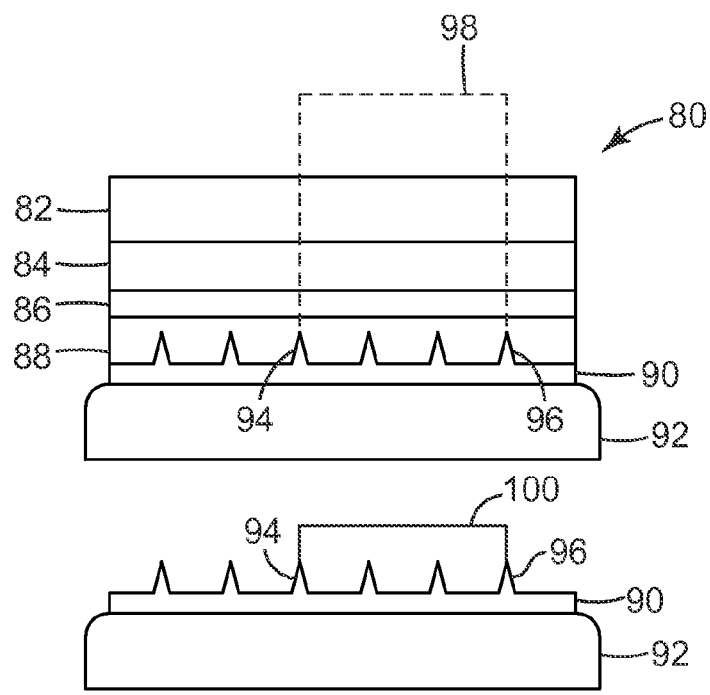
FIG. 6a illustrates imaging of a thermal transfer donor including a transfer layer in order to transfer portions of the transfer layer to a permanent receptor having a structured tool.
Figure 6B:
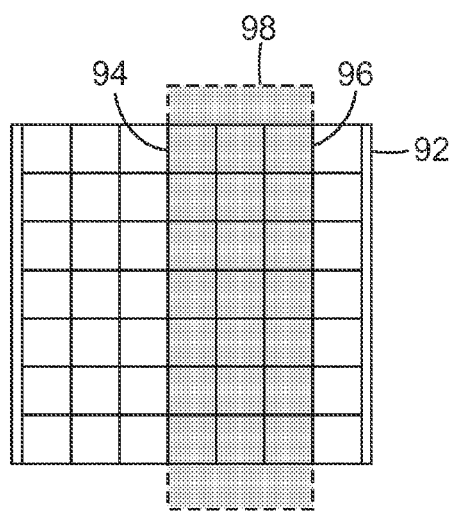
FIGS. 6b and 6c are top views illustrating imaging of the thermal transfer donor of FIG. 6a before and after, respectively, transfer of a portion of the transfer layer to the structured tool.
Figure 6C:
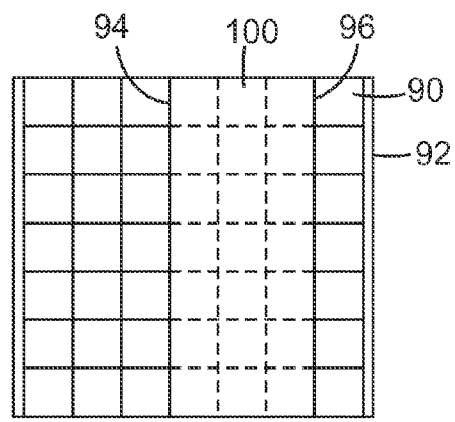

FIG. 6a illustrates imaging of a LITI donor film 80 including a transfer layer in order to transfer portions of the transfer layer to a permanent receptor 92 having a structured tool 90. FIGS. 6b and 6c are top views illustrating imaging of the LITI donor film 80 before and after, respectively, transfer of a portion of the transfer layer to structured tool 90. Donor film 80 includes a substrate 82, LTHC layer 84, optional interlayer 86, and a transfer layer 88. In film 80, substrate 82, LTHC 84, optional interlayer 86, and transfer layer 88 may correspond, respectively, with substrate 12, LTHC 14, interlayer 16, and transfer layer 18 as described above, and transfer layer 88 can optionally be structured as described above. Receptor 92 has tool 90 affixed to it, and tool 90 includes microstructured or nanostructured features such as portions 94 and 96 extending away from a surface of the tool. The structured portions of tool 90 can be arranged in any two-dimensional pattern. Tool 90 can be laminated or otherwise affixed to receptor 92, either permanently or in a removable way.

When imaged at the structured portions 94 and 96 using a laser beam 98 and an imaging method such as that described above, a portion 100 is transferred to permanent receptor 92. As shown, the portion 100 is transferred in a pattern defined by the structured features of the tool and, preferably, the entire transferred portion or substantially all of it has a pattern defined by the structured features of the tool. During imaging, donor film 80 is typically held in intimate contact with permanent receptor 92, and donor film 80 can be laminated to tool 90 prior to imaging and then removed from tool 90 after imaging. The structured portions 94 and 96 of tool 90 provide for break points to assist in providing a release of portion 100 from transfer layer 88 and a well defined edge to transferred portion 100.

Examples of Imaging Structured Patterns

FIGS. 7a-7c are top views demonstrating the use of embodiments of the invention to transfer discontinuous features that have dimensions smaller than the width of the scanned laser beam. FIG. 7a shows the features 112, in this case a pattern of circles, as they are defined by perforations in the transfer layer 110 of the donor film prior to being scanned by the laser. FIG. 7b shows the pattern (dark regions 114) swept out by the laser as it scans across the donor film. FIG. 7c shows the features (dark spots 116) that have been transferred from the donor film 110 to the receptor 116 when imaged by laser scan lines 114. The size of the transferred features 118 in FIG. 7c is defined by the perforation of the transfer film (features 112) rather than by the dimensions of the laser beam. This uniform transfer requires lateral and angular registration between the transfer film 110 and the laser scan lines 114. FIG. 7d demonstrates the transfer of non-uniform features that will occur if there is angular misalignment between the transfer film features 112 and the laser scan lines 114. With the misalignment, many of the transferred portions 118 are only partial circles, as shown in FIG. 7d. The structured pattern shown in the donor film of FIG. 7a can be formed using the exemplary techniques described above, and the donor film can be imaged to transfer at least a portion of the structured pattern to a receptor using the exemplary methods described above.

FIGS. 8a-8c are top views demonstrating the use of embodiments of the invention to transfer features that are continuous in the direction of the laser scan, even if these continuous features contain details smaller than the dimensions of the scanned laser beam. FIG. 8a shows the features 122, in this non-straight case lines, as they are defined by perforations in the transfer layer 120 prior to being scanned by the laser. FIG. 8b shows the pattern (dark regions 124) swept out by the laser as it scans across the donor. FIG. 8c shows the features (dark lines 128) that have been transferred from the donor film 120 to the receptor 126 when imaged by laser scan lines 124. The size of details (e.g., edge patterns) in the transferred features 128 is defined by the perforation features 122 of the transfer layer rather than by the dimensions of the laser beam. This uniform transfer requires lateral and angular registration between the transfer film 120 and the laser scan lines 124. The structured pattern shown in the donor film of FIG. 8a can be formed using the exemplary techniques described above, and the donor film can be imaged to transfer at least a portion of the structured pattern to a receptor using the exemplary methods described above.

As illustrated in FIGS. 7d and 8c, the transfer layer when imaged typically only transfers to the receptor along the scan lines and at or along the perforations or structures, depending upon a material strength in the transfer layer. With a relatively weak film strength, the transfer can occur along both the scan line and the structures, as shown by the partial circles of the transferred structure in FIG. 7d (in comparison to the full circles 112) and by the flat tips of the transferred structure in FIG. 8c (in comparison to the lines 122 having pointed tips). Alternatively, with materials having a relatively high film strength, such as metals, the transfer layer can transfer along the structure or perforations even if only partially imaged by the scan lines. For example, if the transfer layer material in FIG. 7a has a high film strength, some of the full circles 112 can be transferred even if only portions of those circles are in the scan lines 114, and if the transfer layer material in FIG. 8a has a high film strength, the pointed tips of lines 122 can be transferred even if those tips are not within the scan lines 124.

FIGS. 9a-9c are top views demonstrating the use of embodiments of the invention to transfer features that are discontinuous in the direction of the laser scan, even if these discontinuous features contain details smaller than the dimensions of the scanned laser beam. FIG. 9a shows the features 132, in this case a finely-tiled array of squares, as they are defined by perforations in the transfer layer 130 prior to being scanned by the laser. FIG. 9b shows the pattern (dark regions 134) swept out by the laser as it scans across the donor. FIG. 9c shows the features (small dark squares 138) that have been transferred from the donor film 130 to the receptor 136 when imaged by laser scan lines 134. The size of details in the transferred features 138 is defined by the perforation of the transfer layer rather than by the dimensions of the laser beam 134. This uniform transfer requires lateral and angular registration between the transfer film 130 and the laser scan lines 134. The structured pattern shown in the donor film of FIG. 9a can be formed using the exemplary techniques described above, and the donor film can be imaged to transfer at least a portion of the structured pattern to a receptor using the exemplary methods described above.

FIGS. 10a-10d are top views demonstrating the use of embodiments of the invention to transfer features in a particular pattern to match with a pattern in the underlying receptor. FIG. 10a shows the features 142 as they are defined by perforations in the transfer layer 140 prior to being scanned by the laser. FIG. 10b shows the pattern (dark regions 144) swept out by the laser as it scans across the donor. FIG. 10c shows the pattern 148 in the underlying receptor 146 to which the transferred features 142 are to be matched. FIG. 10d shows the features (dark areas 150) that have been transferred from the donor film 140 to the receptor 146 when imaged by laser scan lines 144. In this example, the transferred features 142 have been placed precisely onto the underlying receptor features 148 as desired. This uniform transfer requires lateral and angular registration between the transfer film 140 and the laser scan lines 144. The structured pattern shown in the donor film of FIG. 10a can be formed using the exemplary techniques described above, and the donor film can be imaged to transfer at least a portion of the structured pattern to a receptor using the exemplary methods described above.

The example shown in FIGS. 10a-10d may correspond with patterning a backplane of an active matrix display. In this case, receptor 146 is the backplane, and the receptor features 148 are the subpixels for the display. The "notched" portion at the upper left corner of each subpixel contains a transistor for controlling operation of the subpixel. The transfer layer 140 includes a material, such an OLED material, to form the red, green, and blue light emissive elements of the subpixels. In transferring the transfer layer material to the receptor 146, the pattern of structures 142 allows precise placement in each subpixel 150 without transferring the material to the areas occupied by the transistor for each subpixel. The transfer to a patterned substrate, as illustrated in FIGS. 10a-10d, may also be used for transfer of materials to make a flat panel display, a color filter element such as those used in liquid crystal display (LCD) devices, a fluorescent element, or a phosphorescent element. In addition to the pattern shown in FIG. 10d, the transfer can occur to a substrate having a delta pattern, which is a known configuration of subpixels for each pixel in a display device.

The structures shown in the films of FIGS. 7a, 8a, 9a, and 10a can thus effectively create perforations in the transfer layers to assist in the release of portions of them when imaged. The particular shapes and patterns of the structures are shown for exemplary purposes only; other shapes and patterns are possible. When imaged, the transfer layer typically only transfers to the receptor at or along the perforations or structures, depending upon a material strength in the transfer layer. For example, certain materials, such as metals or brittle materials, have sufficient strength such that imaging of them would not cause transfer of portions of the transfer layer without the benefit of the break points caused by the structures. The patterns of structures allows for imaging and transfer of these types of materials and for transfer of them in various patterns. Thus, as illustrated in FIGS. 7c, 7d, 8c, 9c, and 10d, the transferred portion has a pattern defined by the structured features and, preferably the entire transferred portion or substantially all of it has a pattern defined by the structured features. In other cases, the transfer layer, when composed of a weaker material, can transfer both along the perforations and along the edge of the scanning laser beam.

While the present invention has been described in connection with an exemplary embodiment, it will be understood that many modifications will be readily apparent to those skilled in the art, and this application is intended to cover any adaptations or variations thereof. For example, various types of transfer layer and receptor patterns may be used without departing from the scope of the invention. This invention should be limited only by the claims and equivalents thereof.

The invention claimed is:

1. A method of fabricating a microstructured or nanostructured article, comprising:
   providing a laser induced thermal imaging (LITI) donor film, comprising:
   a substrate;
   a light-to-heat conversion layer overlaying the substrate; and
   a transfer layer overlaying the light-to-heat conversion layer, wherein a surface of the transfer layer includes a plurality of microstructured or nanostructured features extending into the transfer layer, and wherein the transfer layer comprises an inorganic material, an organometallic material, or a multicomponent transfer unit;
   placing the LITI donor film against a surface of a permanent receptor such that the transfer layer is in contact with the surface of the receptor; and
   selectively transferring at least a portion of the transfer layer to the surface of the permanent receptor in a pattern defined by the features.

2. The method of claim 1, wherein the providing step includes forming the microstructured or nanostructured features as a continuous pattern.

3. The method of claim 1, wherein the providing step includes forming the microstructured or nanostructured features as a discontinuous pattern.

4. The method of claim 1, wherein the microstructured or nanostructured features form a first pattern in the transfer layer, wherein the surface of the receptor has a structure forming a second pattern substantially matching the first pattern, and wherein the placing step includes substantially aligning the first pattern with the second pattern.

5. The method of claim 1, wherein the transferring step includes transferring fusible elements to the permanent receptor, and further including the step of fusing the fusible elements subsequent to the transferring step.

6. A method of fabricating a microstructured or nanostructured article, comprising:
   providing a laser induced thermal imaging (LITI) donor film, comprising:
   a substrate;
   a light-to-heat conversion layer overlaying the substrate; and
   a transfer layer overlaying the light-to-heat conversion layer, wherein the transfer layer comprises an inorganic material, an organometallic material, or a multicomponent transfer unit;
   placing the LITI donor film against a surface of a permanent receptor, wherein a surface of the permanent receptor includes a tool having a plurality of microstructured or nanostructured features extending away from a surface of the tool and wherein the transfer layer is in contact with the microstructured or nanostructured features of the tool; and
   selectively transferring at least a portion of the transfer layer to the surface of the permanent receptor having the tool in a pattern defined by the features.

7. A method of fabricating a microstructured or nanostructured article, comprising:
   providing a laser induced thermal imaging (LITI) donor film, comprising:
   a substrate;
   a light-to-heat conversion layer overlaying the substrate; and
   a transfer layer overlaying the light-to-heat conversion layer, wherein the transfer layer comprises an inorganic material, an organometallic material, or a multicomponent transfer unit;
   etching perforations or separations in the transfer layer;
   placing the LITI donor film against a surface of a permanent receptor such that the transfer layer is in contact with the surface of the receptor; and
   selectively transferring at least a portion of the transfer layer to the surface of the permanent receptor in a pattern defined by the perforations or separations.

8. The method of claim 7, wherein the transfer layer comprises a light emitting material.

9. The method of claim 8, wherein the transfer layer comprises a phosphor.

10. The method of claim 7, wherein the transfer layer comprises a semiconducting material.

11. The method of claim 10, wherein the semiconducting material is light emitting.

12. A method of fabricating a microstructured or nanostructured article, comprising:
    providing a laser induced thermal imaging (LITI) donor film, comprising:
    a substrate;
    a light-to-heat conversion layer overlaying the substrate;
    a release layer overlaying the light-to-heat conversion layer; and
    a transfer layer overlaying the release layer, wherein the transfer layer comprises an inorganic material, an organometallic material, or a multicomponent transfer unit;
    etching perforations or separations in the transfer layer;
    placing the LITI donor film against a surface of a permanent receptor such that the transfer layer is in contact with the surface of the receptor; and
    selectively transferring at least a portion of the transfer layer to the surface of the permanent receptor in a pattern defined by the perforations or separations.

13. A method of fabricating a microstructured or nanostructured article, comprising:
    providing a laser induced thermal imaging (LITI) donor film, comprising:
    a substrate;
    a light-to-heat conversion layer overlaying the substrate;
    a release layer overlaying the light-to-heat conversion layer; and
    a transfer layer overlaying the release layer, wherein the transfer layer comprises an inorganic material, an organometallic material, or a multicomponent transfer unit;
    etching perforations or separations in the transfer layer;
    applying an adhesive layer to the transfer layer;
    placing the LITI donor film against a surface of a permanent receptor such that the transfer layer is in contact with the surface of the receptor; and
    selectively transferring at least a portion of the transfer layer to the surface of the permanent receptor in a pattern defined by perforations or separations.

14. A method of fabricating a microstructured or nanostructured article, comprising:
    providing a laser induced thermal imaging (LITI) donor film, comprising:
    a substrate;
    a light-to-heat conversion layer overlaying the substrate; and a transfer layer overlaying the light-to-heat conversion layer, wherein the transfer layer comprises an inorganic material, an organometallic material, or a multicomponent transfer unit;

etching perforations or separations in the transfer layer;

applying an adhesive layer to the transfer layer;

placing the LITI donor film against a surface of a permanent receptor such that the transfer layer is in contact with the surface of the receptor; and selectively transferring at least a portion of the transfer layer to the surface of the permanent receptor in a pattern defined by perforations or separations.

15. A method of fabricating a microstructured or nanostructured article, comprising:

providing a laser induced thermal imaging (LITI) donor film, comprising:

a substrate;

a light-to-heat conversion layer overlaying the substrate; and a perforated or separated transfer layer overlaying the light-to-heat conversion layer, wherein the transfer layer comprises an inorganic material, an organometallic material, or a multicomponent transfer unit;

etching perforations or separations in the transfer layer;

placing the LIII donor film against a surface of a permanent receptor such that the transfer layer is in contact with the surface of the receptor; and selectively transferring at least a portion of the transfer layer to the surface of the permanent receptor in a pattern defined by the perforations or separations.

* * * * *

UNITED STATES PATENT AND TRADEMARK OFFICE
CERTIFICATE OF CORRECTION

| | |
|---|---|
| PATENT NO. | : 7,592,120 B2 |
| APPLICATION NO. | : 12/181398 |
| DATED | : September 22, 2009 |
| INVENTOR(S) | : John E. Potts |

Page 1 of 1

It is certified that error appears in the above-identified patent and that said Letters Patent is hereby corrected as shown below:

Column 14

Line 9; Claim 15, delete "LIII" and insert --LITI-- therefor.

Signed and Sealed this

Sixteenth Day of February, 2010

David J. Kappos
*Director of the United States Patent and Trademark Office*